United States Patent
Koya et al.

(10) Patent No.: US 12,494,749 B2
(45) Date of Patent: Dec. 9, 2025

(54) POWER AMPLIFIER

(71) Applicant: Murata Manufacturing Co., Ltd., Kyoto-fu (JP)

(72) Inventors: Shigeki Koya, Nagaokakyo (JP); Shaojun Ma, Nagaokakyo (JP); Shinnosuke Takahashi, Yokosuka (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 434 days.

(21) Appl. No.: 18/328,653

(22) Filed: Jun. 2, 2023

(65) Prior Publication Data

US 2023/0318543 A1 Oct. 5, 2023

Related U.S. Application Data

(63) Continuation of application No. PCT/JP2021/038989, filed on Oct. 21, 2021.

(30) Foreign Application Priority Data

Dec. 4, 2020 (JP) .................................. 2020-202157

(51) Int. Cl.
 *H03F 3/21* (2006.01)
 *H10D 10/40* (2025.01)

(52) U.S. Cl.
 CPC ............. *H03F 3/21* (2013.01); *H10D 10/441* (2025.01); *H03F 2200/451* (2013.01)

(58) Field of Classification Search
 CPC .... H03F 3/21; H03F 2200/451; H10D 10/441
 USPC ........................................................ 330/307
 See application file for complete search history.

(56) References Cited

U.S. PATENT DOCUMENTS

2007/0257332 A1\* 11/2007 Kurokawa ........... H10D 62/177
 257/E29.189

FOREIGN PATENT DOCUMENTS

| EP | 1353384 A2 * | 10/2003 | ........... H10D 64/281 |
| JP | H04-10804 A | 1/1992 | |
| JP | 2004274430 A * | 9/2004 | |
| JP | 2007-012968 A | 1/2007 | |

(Continued)

OTHER PUBLICATIONS

Lesson 3 Power Bipolar Junction Transistor (BJT), Kharagpur IIT, 2020. (Year: 2020).\*

(Continued)

*Primary Examiner* — Hafizur Rahman
(74) *Attorney, Agent, or Firm* — Studebaker Brackett PLLC (57) ABSTRACT

A power amplifier comprising amplifier circuits of multiple stages. Each of the amplifier circuits of multiple stages includes a bipolar transistor and a base electrode. The bipolar transistor included in each of the amplifier circuits of multiple stages includes a collector layer, a base layer placed on the collector layer, and an emitter mesa placed on part of the region of the base layer. The emitter mesa has a shape elongated in one direction in plan view. The base electrode includes a base main portion arranged in such a manner as to be separated from the emitter mesa with a gap in a direction orthogonal to a lengthwise direction of the emitter mesa in plan view. The base main portion has a shape elongated in a direction parallel to the lengthwise direction of the emitter mesa in plan view and is electrically connected to the base layer.

12 Claims, 9 Drawing Sheets

(56) References Cited

FOREIGN PATENT DOCUMENTS

| | | |
|---|---|---|
| JP | 2013-120930 A | 6/2013 |
| JP | 2020-028108 A | 2/2020 |
| JP | 2020-184580 A | 11/2020 |
| WO | 2002/056461 A1 | 7/2002 |

OTHER PUBLICATIONS

International Search Report issued in PCT/JP2021/038989; mailed Jan. 11, 2022.

* cited by examiner

POWER AMPLIFIER

CROSS-REFERENCE TO RELATED APPLICATIONS

This application claims benefit of priority to International Patent Application No. PCT/JP2021/038989, filed Oct. 21, 2021, and to Japanese Patent Application No. 2020-202157, filed Dec. 4, 2020, the entire contents of each are incorporated herein by reference.

BACKGROUND

Technical Field

The present disclosure relates to power amplifiers.

Background Art

With the introduction of the fifth-generation mobile communication system (5G) and high-power user equipment (HPUE), it is desirable to increase the maximum output power (hereinafter, in some cases, also simply referred to as maximum output) and the power gain (hereinafter, in some cases, also simply referred to as gain) of a power amplifier for wireless communication. For the power amplifier for wireless communication, a heterojunction bipolar transistor (HBT) is used.

In the HBT, the gain is influenced by a base-collector junction capacitance Cbc, and as the base-collector junction capacitance Cbc increases, the gain decreases. In order to have a higher gain, it is preferable to have a base-collector junction capacitance Cbc that is as small as possible. The area of a base-collector junction interface can be reduced by thinning a base electrode placed on a base layer. When the area of the base-collector junction interface becomes smaller, the base-collector junction capacitance Cbc decreases.

However, when the base electrode is made thinner, a parasitic resistance of the base electrode increases. When the parasitic resistance of the base electrode increases, the maximum output of the HBT decreases. The following Japanese Unexamined Patent Application Publication No. 2007-12968 discloses an HBT that suppresses the increase in the parasitic resistance and suppresses the enlargement of the area of a base-emitter junction interface.

The area of the base-emitter junction interface can be reduced by thinning the base electrode. However, the thinning of the base electrode has limitations of processes. Further, when the base electrode is made thinner, it becomes difficult to form an extended line that is in contact with a top surface of the base electrode. In the HBT disclosed in Japanese Unexamined Patent Application Publication No. 2007-12968, the area of a base-collector junction interface is made smaller by removing a base layer and a collector layer positioned directly below part of the base electrode that has a wider width. The gain is increased without incurring a decrease in the maximum output by not thinning the base electrode but by suppressing the enlargement of the base-collector junction interface.

SUMMARY

In the HBT disclosed in Japanese Unexamined Patent Application Publication No. 2007-12968, because the base layer and the collector layer positioned directly below part of the base electrode are removed, the fabrication process becomes complicated, and the fabrication cost rises. Accordingly, the present disclosure provides a power amplifier capable of increasing the maximum output and the gain without complicating the fabrication process.

According to one perspective of the present disclosure, there is provided a power amplifier including amplifier circuits of multiple stages. Each of the amplifier circuits of multiple stages includes at least one bipolar transistor and a base electrode. Each bipolar transistor included in each of the amplifier circuits of multiple stages includes a collector layer placed on a substrate, a base layer placed on the collector layer, and at least one emitter mesa placed on part of a region of the base layer, and the at least one emitter mesa has a shape elongated in one direction in plan view. The base electrode includes at least one base main portion arranged in such a manner as to be separated from the emitter mesa with a gap in a direction orthogonal to a lengthwise direction of the emitter mesa in plan view, and the base main portion of the base electrode has a shape elongated in a direction parallel to the lengthwise direction of the emitter mesa in plan view and is electrically connected to the base layer. Also, of the amplifier circuits of multiple stages, a width, which is a dimension in the direction orthogonal to the lengthwise direction, of each base main portion of the bipolar transistor of a final stage amplifier circuit is wider than a width, which is a dimension in the direction orthogonal to the lengthwise direction, of each base main portion of the bipolar transistor of another stage amplifier circuit.

When the width of the base main portion of the bipolar transistor of the final stage amplifier circuit is widened, the parasitic resistance of the base electrode decreases. Because of this, the maximum output of the final stage amplifier circuit can be increased. In a preceding stage amplifier circuit, the width of the base main portion of the bipolar transistor is narrowed, and thus, it becomes possible to reduce the area of the base-collector junction interface. When the area of the base-collector junction interface becomes smaller, the base-collector junction capacitance decreases, and the gain increases. By increasing the gain of the preceding stage amplifier circuit and increasing the maximum output of the final stage amplifier circuit, it becomes possible to increase the maximum output of the power amplifier as a whole without reducing the gain. Further, a complicated fabrication process is not required for adjusting the width of the base main portion.

DETAILED DESCRIPTION

First Example

Referring to drawings of FIG. 1A to FIG. 4, a power amplifier for wireless communication according to a first example is described.

Figure 1A:
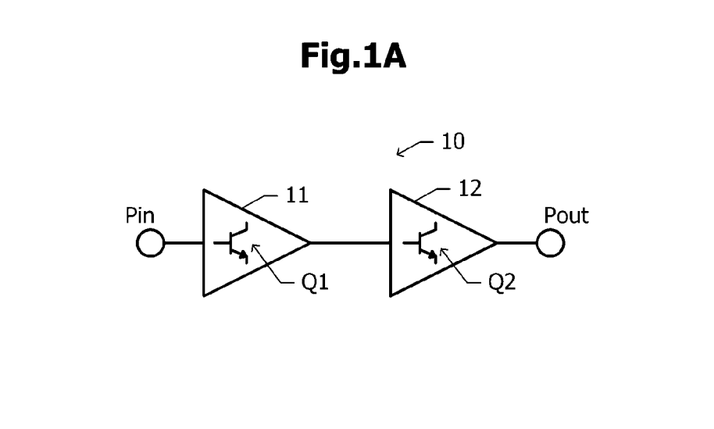
FIG. 1A is a block diagram of a power amplifier according to a first example.

FIG. 1A is a block diagram of a power amplifier 10 according to the first example. The power amplifier 10 according to the first example has a two-stage configuration that includes a preceding stage amplifier circuit 11 and a final stage amplifier circuit 12. The preceding stage amplifier circuit 11 includes at least one bipolar transistor Q1, and the final stage amplifier circuit 12 includes a plurality of bipolar transistors Q2 that are connected in parallel to each other. A radio frequency signal input from an input port Pin is amplified by the preceding stage amplifier circuit 11. A radio frequency signal output from the preceding stage amplifier circuit 11 is amplified by the final stage amplifier circuit 12. A radio frequency signal output from the final stage amplifier circuit 12 is output from an output port Pout to an external circuit.

Figure 1B:
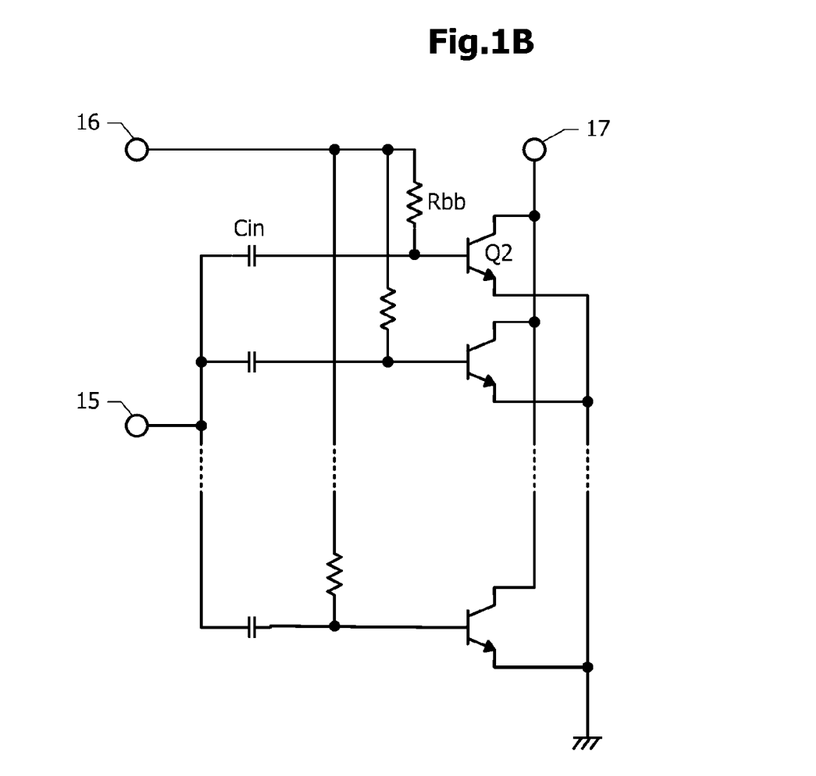
FIG. 1B is an equivalent circuit diagram of a final stage amplifier circuit of the power amplifier according to the first example.

FIG. 1B is an equivalent circuit diagram of the final stage amplifier circuit 12 of the power amplifier 10 according to the first example. The final stage amplifier circuit 12 includes a plurality of bipolar transistors Q2 connected in parallel to each other. As the plurality of bipolar transistors Q2, for example, heterojunction bipolar transistors (HBT) are used. Bases of the plurality of bipolar transistors Q2 are connected to an input line 15 for a radio frequency signal with corresponding input capacitors Cin interposed therebetween. Moreover, the bases of the plurality of bipolar transistors Q2 are connected to a base bias line 16 with corresponding base ballast resistive elements Rbb interposed therebetween.

A radio frequency signal is input from the input line 15 to the base of the bipolar transistor Q2 via the input capacitor Cin. A base bias current is supplied from the base bias line 16 to the base of the bipolar transistor Q2 via the base ballast resistive element Rbb. Collectors of the plurality of bipolar transistors Q2 are connected to an output line 17, and emitters of the plurality of bipolar transistors Q2 are grounded.

The basic circuit configuration of the preceding stage amplifier circuit 11 is the same as the circuit configuration of the final stage amplifier circuit 12 (FIG. 1B). Note that the number of the bipolar transistors to be connected in parallel to each other is different in the preceding stage and the final stage. Note that the number of the bipolar transistors Q1 in the preceding stage amplifier circuit 11 may be set to one.

Figure 2:
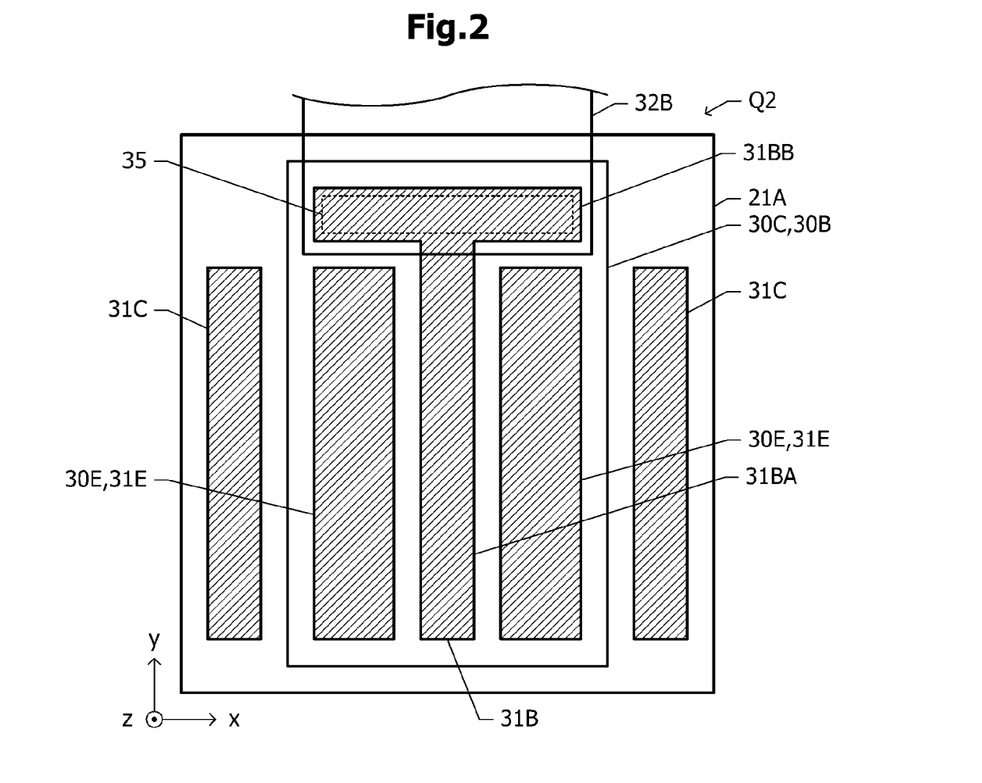
FIG. 2 is a schematic plan view of one bipolar transistor of the final stage amplifier circuit.

FIG. 2 is a schematic plan view of one bipolar transistor Q2 of the final stage amplifier circuit 12. Note that the spatial relationship among constituent elements of the bipolar transistor Q1 of the preceding stage amplifier circuit 11 in plan view is similar to the spatial relationship among constituent elements of the bipolar transistor Q2 of the final stage amplifier circuit 12 in plan view. A collector layer 30C and a base layer 30B are placed in a conductive region 21A that is set in a surface layer portion of a substrate. In plan view, the collector layer 30C and the base layer 30B nearly overlap with each other.

In plan view, two emitter mesas 30E are placed in the base layer 30B. Each of the two emitter mesas 30E has a shape elongated in one direction in plan view, and the lengthwise directions of the two emitter mesas 30E are parallel to each other. An x-y-z orthogonal coordinate system is defined where the y-direction is the lengthwise direction of the emitter mesa 30E and the z-direction is the direction normal to the substrate. The shape of each of the two emitter mesas 30E in plan view is, for example, a rectangle, and the two emitter mesas 30E are congruent. The two emitter mesas 30E are arranged in such a manner as to be separated from each other with a gap in the x-direction.

In FIG. 2, hatching is applied to a base electrode 31B, an emitter electrode 31E, and a collector electrode 31C. The base electrode 31B is made up of a base main portion 31BA and a base contact portion 31BB. The base main portion 31BA is placed between the two emitter mesas 30E and has a shape elongated in the y-direction in plan view. The shape of the base main portion 31BA in plan view is, for example, a rectangle. The base contact portion 31BB has a shape elongated in the x-direction and is arranged in such a manner as to be separated from the same side end portions of the two emitter mesas 30E with a gap in the y-direction. One end portion of the base main portion 31BA is connected to a center point of the base contact portion 31BB. That is to say, the base electrode 31B has a T-shaped form in plan view.

The emitter electrode 31E has a shape that nearly overlaps with the emitter mesa 30E in plan view. The two collector electrodes 31C are arranged in the conductive region 21A and placed at positions that sandwich the collector layer 30C in the x-direction. Each of the collector electrodes 31C has a shape elongated in the y-direction in plan view.

An end portion of a base line 32B overlaps with the base contact portion 31BB. The base line 32B is connected to the base contact portion 31BB through an opening 35 formed in an interlayer insulating film, which is placed below the base line 32B. Gaps between the base main portion 31BA and the emitter mesas 30E on both sides of the base main portion 31BA are equal to each other.

Figure 3A:
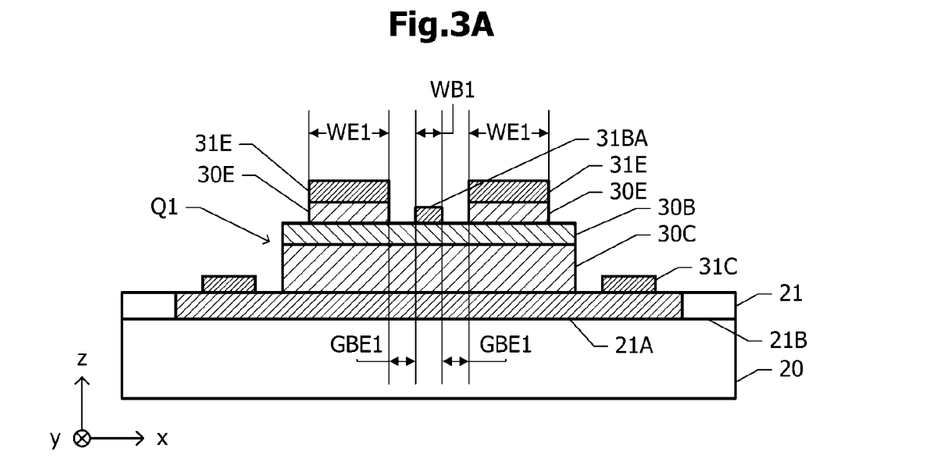
FIG. 3A and FIG. 3B are sectional views of bipolar transistors of a preceding stage amplifier circuit and the final stage amplifier circuit, respectively.
Figure 3B:
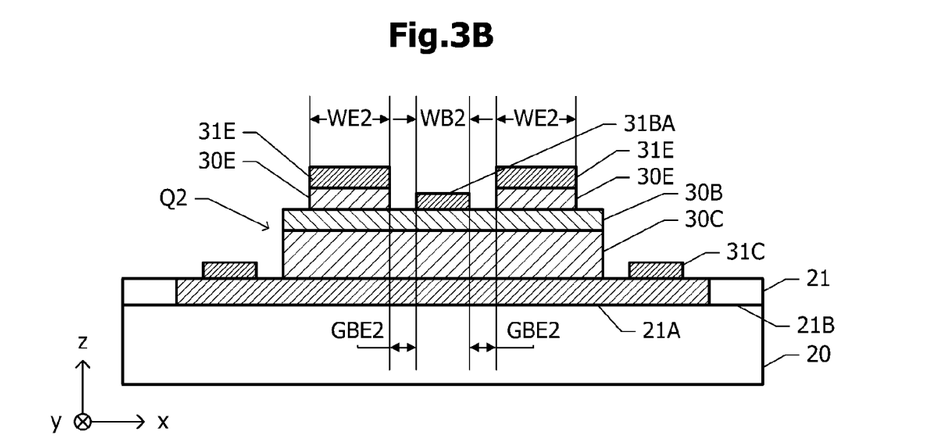

FIG. 3A and FIG. 3B are a sectional view of the bipolar transistor Q1 of the preceding stage amplifier circuit 11 (FIG. 1A) and a sectional view of the bipolar transistor Q2 of the final stage amplifier circuit 12 (FIG. 1A), respectively. A semiconductor underlayer 21 is placed on a substrate 20. The semiconductor underlayer 21 is sectioned into a plurality of conductive regions 21A and element isolation regions 21B that electrically separate the conductive regions 21A from each other. The conductive region 21A is made of, for example, n-type GaAs, and the element isolation region 21B is formed by insulating an n-type GaAs layer by implanting ions of an impurity or impurities into the n-type GaAs layer.

The collector layer 30C is placed on part of the region of the conductive region 21A, and the base layer 30B is placed on the collector layer 30C. The two emitter mesas 30E are arranged on part of the region of the base layer 30B in such a way that the two emitter mesas 30E are separated from each other in x-direction. The collector layer 30C is made of, for example, n-type GaAs, and the base layer 30B is made of, for example, p-type GaAs. The emitter mesa 30E is made of, for example, n-type InGaP. An n-type GaAs layer may be placed on the emitter mesa 30E. Note that an n-type InGaP layer may be placed on the whole area of the base layer 30B, and an n-type GaAs layer may be placed on part of the region thereof. In this case, of the n-type InGaP layer, the region that does not overlap with the n-type GaAs layer in plan view is depleted, and thus, the region overlapping with the n-type GaAs layer substantially functions as an emitter layer. In this case, the n-type GaAs layer is referred to as the emitter mesa 30E.

On the conductive region 21A, the two collector electrodes 31C are arranged in such a manner as to sandwich the collector layer 30C in the x-direction. The two collector electrodes 31C are electrically connected to the collector layer 30C via the conductive region 21A. The base main portion 31BA of the base electrode 31B (FIG. 2) is placed on the base layer 30B between the two emitter mesas 30E. The base main portion 31BA is electrically connected to the base layer 30B. The emitter electrode 31E is placed on each of the two emitter mesas 30E. The emitter electrode 31E is electrically connected to the emitter mesa 30E.

Dimensions of respective constituent elements of the bipolar transistor Q1 of the preceding stage amplifier circuit 11 (hereinafter, in some cases, simply referred to as "preceding stage bipolar transistor Q1") are represented as follows, as illustrated in FIG. 3A. The width (dimension in the x-direction) of the emitter mesa 30E is represented as WE1, the width (dimension in the x-direction) of the base main portion 31BA is represented as WB1, and the gap between the base main portion 31BA and the emitter mesa 30E in the x-direction is represented as GBE1.

Dimensions of respective constituent elements of the bipolar transistor Q2 of the final stage amplifier circuit 12 (hereinafter, in some cases, simply referred to as "final stage bipolar transistor Q2") are represented as follows, as illustrated in FIG. 3B. The width (dimension in the x-direction) of the emitter mesa 30E is represented as WE2, the width (dimension in the x-direction) of the base main portion 31BA is represented as WB2, and the gap between the base main portion 31BA and the emitter mesa 30E in the x-direction is represented as GBE2.

The width WB2 of the base main portion 31BA of the final stage bipolar transistor Q2 is wider than the width WB1 of the base main portion 31BA of the preceding stage bipolar transistor Q1. The width WE2 and the gap GBE2 in the final stage bipolar transistor Q2 are approximately equal to the width WE1 and the gap GBE1 of the preceding stage bipolar transistor Q1. The area of the base-collector junction interface of the preceding stage bipolar transistor Q1 is smaller than the area of the base-collector junction interface of the final stage bipolar transistor Q2. Further, the width (dimension in the x-direction) of the base-collector junction interface of the preceding stage bipolar transistor Q1 is narrower than the width (dimension in the x-direction) of the base-collector junction interface of the final stage bipolar transistor Q2.

Figure 4:
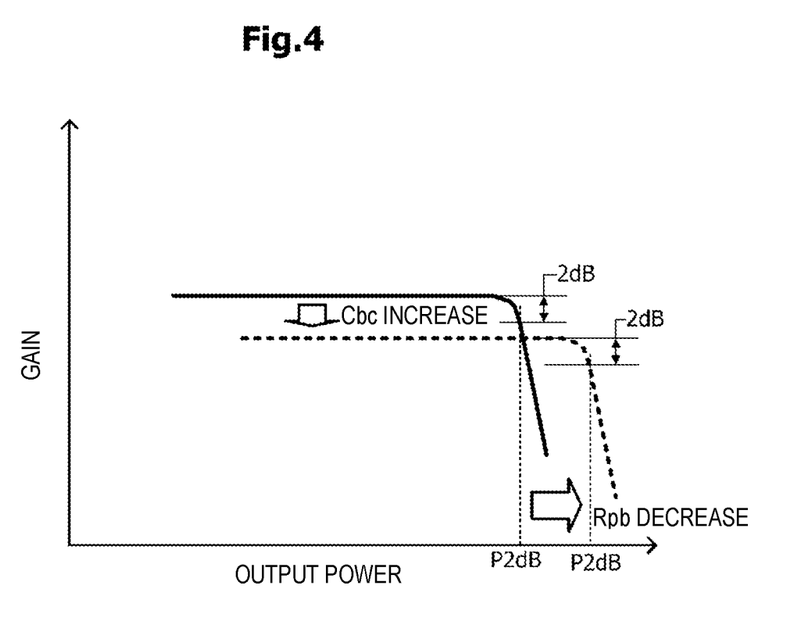
FIG. 4 is a graph illustrating relationships between the output power and the gain of a general bipolar transistor.

Next, referring to FIG. 4, advantageous effects of the first example are described.

FIG. 4 is a graph illustrating relationships between the output power and the gain of a general bipolar transistor. The horizontal axis represents the output power, and the vertical axis represents the gain. As illustrated by the solid line in FIG. 4, a nearly constant gain can be obtained when the output power is in a certain range, and the gain decreases sharply when the output power exceeds a certain value. In some cases, the output power at which the gain decreases by 2 dB from a gain in the range where the gain is nearly constant is referred to as the output power P2$d$B at 2 dB gain compression point. For example, the output power P2$d$B at 2 dB gain compression point is one index that indicates the maximum output of this transistor.

As illustrated by the dashed line in FIG. 4, by reducing the parasitic resistance Rpb of the base electrode 31B, the output power P2$d$B at 2 dB gain compression point can be increased. However, when the width of the base main portion 31BA (FIG. 3B) is widened in order to reduce the parasitic resistance Rpb of the base electrode 31B, the area of the base-collector junction interface increases, and the base-collector junction capacitance Cbc increases. Note that the area of the emitter mesa 30E (FIG. 2) is determined by a target output current and thus cannot be reduced unconditionally. When the base-collector junction capacitance Cbc increases, as illustrated by the dashed line in FIG. 4B, the gain decreases. It is difficult to increase the output power P2$d$B without incurring a decrease in the gain.

In the first example, the width WB2 (FIG. 3B) of the base main portion 31BA of the final stage bipolar transistor Q2 is wider than the width WB1 (FIG. 3A) of the base main portion 31BA of the preceding stage bipolar transistor Q1. Because of this, the parasitic resistance Rpb of the base electrode 31B of the final stage bipolar transistor Q2 is lower than the parasitic resistance Rpb of the base electrode 31B of the preceding stage bipolar transistor Q1. The maximum output of the final stage amplifier circuit 12 can be increased by reducing the parasitic resistance Rpb of the base electrode 31B of the final stage bipolar transistor Q2.

When the width of the base main portion 31BA of the final stage bipolar transistor Q2 is widened, the base-collector junction capacitance Cbc increases, and the gain decreases. In the first example, the base-collector junction capacitance Cbc is reduced by making the area of the base-collector junction interface smaller by narrowing the width WB1 (FIG. 3A) of the base main portion 31BA of the preceding stage bipolar transistor Q1. For example, the area of the base-collector junction interface of the preceding stage bipolar transistor Q1 is narrower than the area of the base-collector junction interface of the final stage bipolar transistor Q2. Because of this, the gain of the preceding stage amplifier circuit 11 can be increased.

As described above, in the first example, the gain, which is reduced due to the increase in the maximum output of the final stage amplifier circuit 12, is compensated by increasing the gain of the preceding stage amplifier circuit 11. Because of this, in the power amplifier 10 having the two-stage configuration, it becomes possible to increase the maximum output without reducing the gain.

Further, in the first example, the maximum outputs and the gains of the bipolar transistors Q1 and Q2 are set to preferred values by adjusting the widths of the base main portions 31BA. Because of this, both an increase in the maximum output and the suppression of a decrease in the gain can be achieved without complicating the fabrication process.

Next, preferred dimensions of the emitter mesa 30E and the base main portion 31BA are described. In order to increase the effect of reducing the parasitic resistance Rpb of the base electrode 31B, in the final stage bipolar transistor Q2 (FIG. 3B), it is preferable to set the width WB2 of the base main portion 31BA to be greater than or equal to 40% of the width WE2 of each of the emitter mesas 30E. Note that in the case where the width WB2 of the base main portion 31BA is made wider than necessary, an impact of the gain decrease caused by the increase in the base-collector junction capacitance Cbc becomes pronounced, compared with the effect of the maximum output increase caused by the reduction of the parasitic resistance Rpb. In order to suppress the impact of the gain decrease, it is preferable to set the width WB2 of the base main portion 31BA to be less than or equal to 70% of the width WE2 of each of the emitter mesas 30E.

In the preceding stage bipolar transistor Q1 (FIG. 3A), in order to increase the gain by reducing the base-collector junction capacitance Cbc, it is preferable to set the width WB1 of the base main portion 31BA to be less than or equal to 60% of the width WB2 of the base main portion 31BA of the final stage bipolar transistor Q2.

In the preceding stage bipolar transistor Q1 and the final stage bipolar transistor Q2 (FIG. 3A and FIG. 3B), the base-collector junction capacitance Cbc increases when the gap GBE1/GBE2 between the emitter mesa 30E and the base main portion 31BA is widened. In order to suppress the increase in the base-collector junction capacitance Cbc, it is preferable to set the gap GBE1 and the gap GBE2 to be less than or equal to 60% of the width WE1 of the emitter mesa 30E and 60% of the width WE2 of the emitter mesa 30E, respectively.

Next, a preferred relationship between the area of the base-collector junction interface and the area of the base electrode 31B in plan view is described. For example, the preceding stage bipolar transistor Q1 (FIG. 3A) and the final stage bipolar transistor Q2 (FIG. 3B) are the same regarding the area of the emitter mesa 30E in plan view. At that time, the ratio of the area of the base electrode 31B in plan view to the area of the base-collector junction interface is greater in the final stage bipolar transistor Q2 than in the preceding stage bipolar transistor Q1.

Even in the case where the preceding stage bipolar transistor Q1 (FIG. 3A) and one of the final stage bipolar transistors Q2 (FIG. 3B) are different in the area of the emitter mesa 30E in plan view, with regard to the ratio of the area of the base electrode 31B in plan view to the area of the base-collector junction interface, it is preferable that the ratio of the areas in the final stage bipolar transistor Q2 is set to be greater than the ratio of the areas in the preceding stage bipolar transistor Q1. Such a configuration facilitates the effect of reducing the parasitic resistance Rpb of the base electrode 31B of the final stage bipolar transistor Q2.

Figure 5:
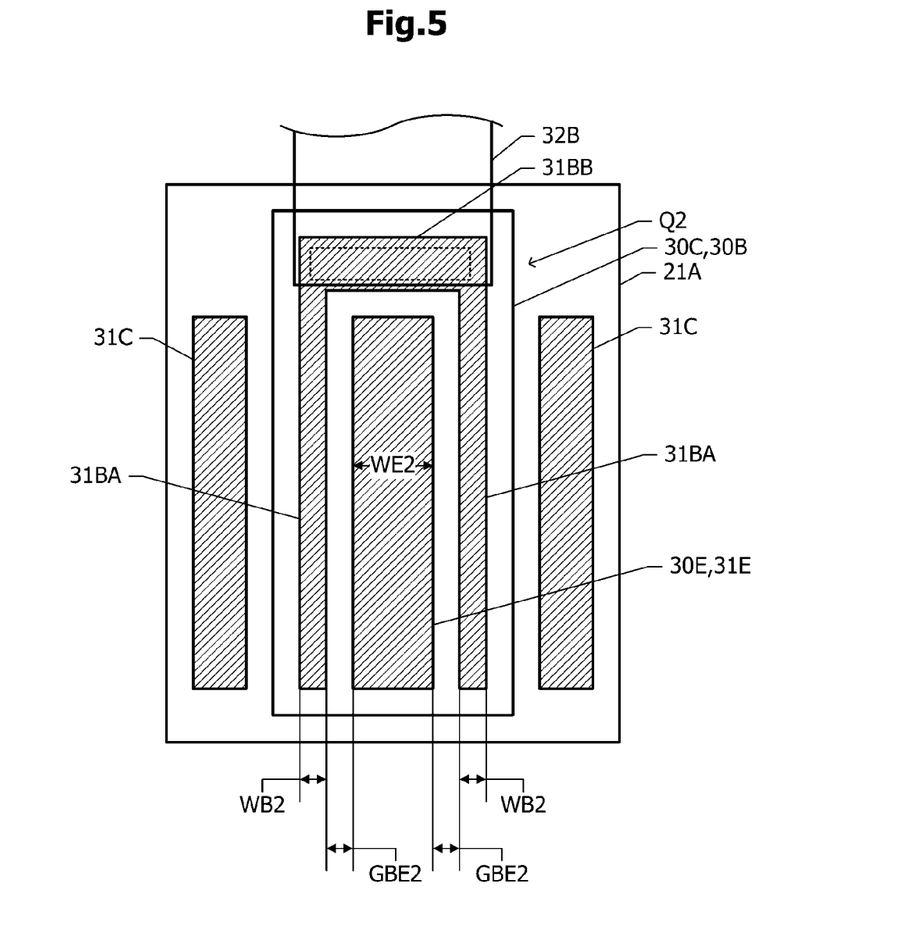
FIG. 5 is a schematic plan view of a final stage bipolar transistor of a power amplifier according to a modified example of the first example.

Next, referring to FIG. 5, a power amplifier according to a modified example of the first example is described.

FIG. 5 is a schematic plan view of one of final stage bipolar transistors Q2 of a power amplifier according to a modified example of the first example. Note that the spatial relationship among constituent elements of the preceding stage bipolar transistor Q1 in plan view is similar to the spatial relationship among constituent elements of the final stage bipolar transistor Q2 in plan view. In the first example (FIG. 2), the base main portion 31BA is placed between the two emitter mesas 30E. In contrast, in the present modified example, one emitter mesa 30E is placed between two base main portions 31BA. The same side end portions of the two base main portions 31BA are connected to each other by the base contact portion 31BB.

As in the present modified example, in the case where a plurality of base main portions 31BA are included in each of the bipolar transistors Q1 and Q2, it is favorable to set the width WB2 of the base main portion 31BA of the final stage bipolar transistor Q2 to be wider than the width WB1 of the base main portion 31BA of the preceding stage bipolar transistor Q1.

Figure 6:
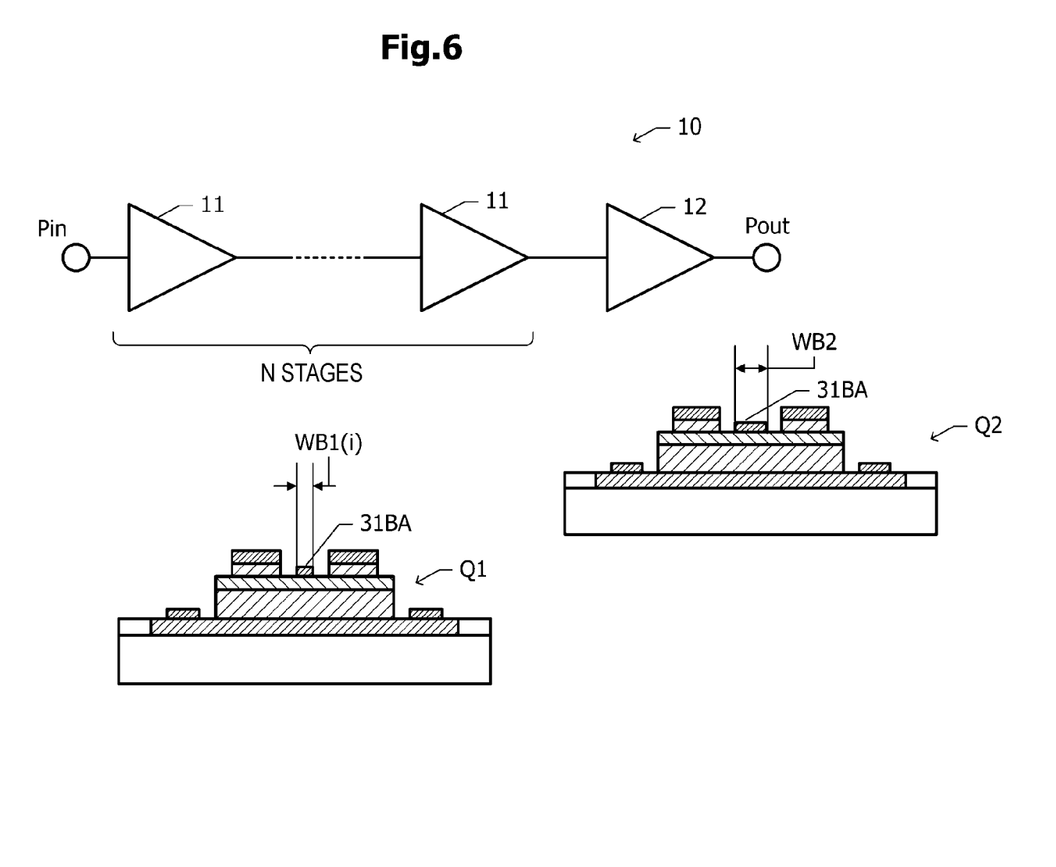
FIG. 6 illustrates a block diagram of a power amplifier according to another modified example of the first example and sectional views of bipolar transistors thereof.

Next, referring to FIG. 6, a power amplifier according to another modified example of the first example is described.

FIG. 6 illustrates a block diagram of a power amplifier according to the present modified example and sectional views of bipolar transistors thereof. In the first example, the power amplifier 10 has the two-stage configuration including the preceding stage and the final stage. In contrast, in the present modified example, the power amplifier 10 has a multi-stage configuration having three or more stages. That is to say, the power amplifier 10 is made up of N preceding stage amplifier circuits 11 that are connected in a cascading manner and the final stage amplifier circuit 12. Here, N is an integer greater than or equal to 2.

Of the preceding stage amplifier circuits 11, the width of the base main portion 31BA of the bipolar transistor Q1 of the i-th amplifier circuit 11 is represented as WB1($i$). For the N preceding stage amplifier circuits 11, the width WB1($i$) of the base main portion 31BA of the bipolar transistor Q1 may be the same or different among N amplifier circuits 11. The width WB2 of the base main portion 31BA of the final stage bipolar transistor Q2 is wider than the width WB1($i$) of the base main portion 31BA of any one of the preceding stage bipolar transistors Q1.

As in the present modified example, in the case where the power amplifier 10 has the multi-stage configuration including three or more stages, the maximum output can be increased by making the width WB2 of the base main portion 31BA of the final stage bipolar transistor Q2 widest. Note that it is favorable to obtain a necessary gain by using the N preceding stage amplifier circuits 11.

Second Example

Figure 7:
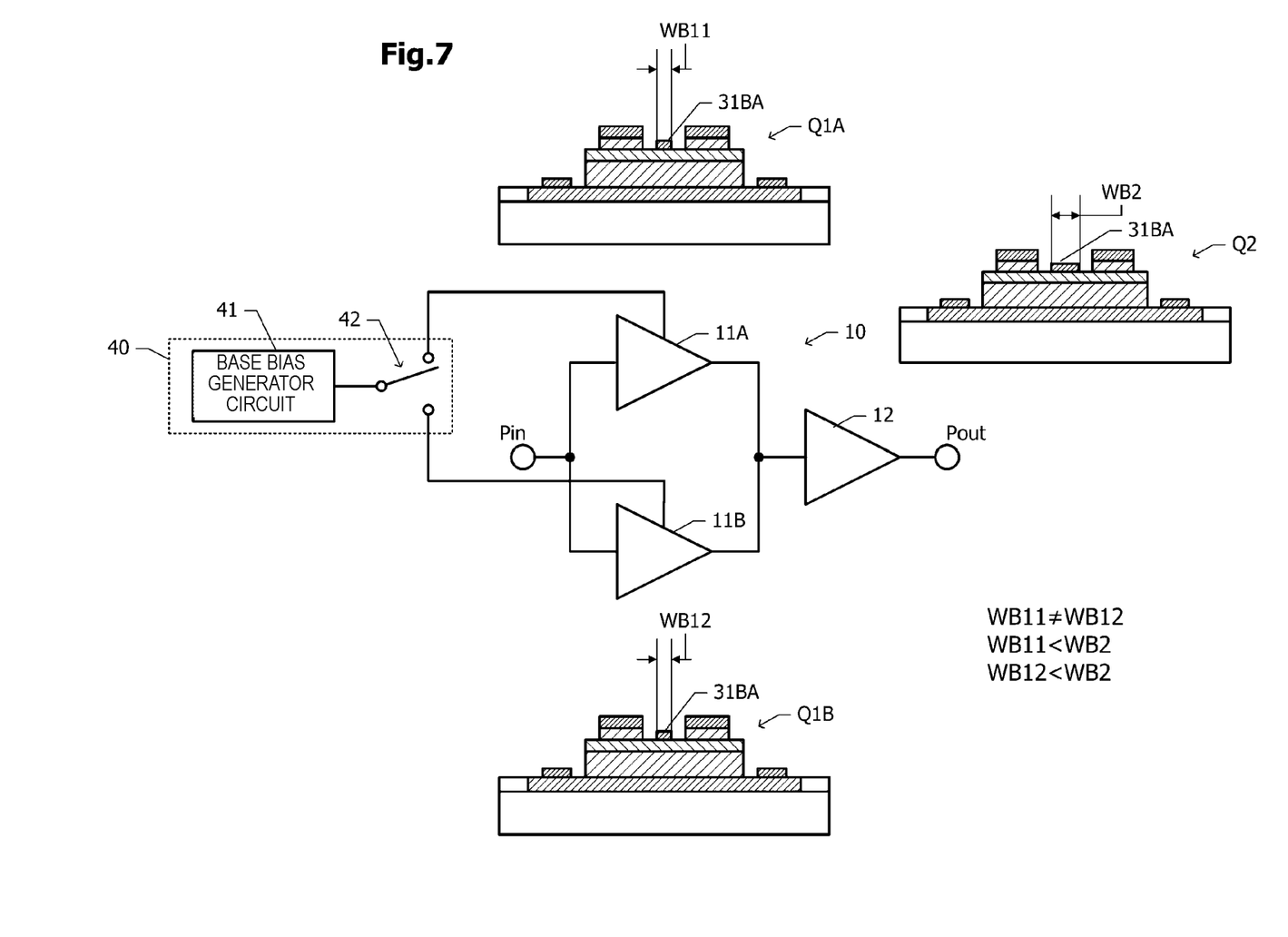
FIG. 7 illustrates a block diagram of a power amplifier according to a second example and schematic sectional views of plural bipolar transistors being used in the power amplifier.

Next, referring to FIG. 7, a power amplifier according to a second example is described. In the following section, descriptions regarding configurations common to those of the power amplifier according to the first example described with reference to the drawings of FIG. 1 to FIG. 4 are omitted.

FIG. 7 illustrates a block diagram of the power amplifier 10 according to the second example and schematic sectional views of plural bipolar transistors being used in the power amplifier 10. In the first example (FIG. 1A), the final stage amplifier circuit 12 is preceded by and connected to a single unit of the amplifier circuit 11. In contrast, in the second example, the final stage amplifier circuit 12 is preceded by and connected to a first amplifier circuit 11A and a second amplifier circuit 11B. The first amplifier circuit 11A and the second amplifier circuit 11B are connected in parallel at input side and further connected in parallel at output side.

A base bias circuit 40 includes a base bias generator circuit 41 and a switch 42. A base bias is supplied from the base bias generator circuit 41 to one of the first amplifier circuit 11A and the second amplifier circuit 11B via the switch 42. The amplifier circuit that becomes a supply destination of the base bias is selected by the switch 42.

The first amplifier circuit 11A includes a plurality of bipolar transistors Q1A, and the second amplifier circuit 11B includes a plurality of bipolar transistors Q1B. A width WB11 of the base main portion 31BA of the bipolar transistor Q1A is different from a width WB12 of the base main portion 31BA of the bipolar transistor Q1B. Further, the width WB2 of the base main portion 31BA of the final stage bipolar transistor Q2 is wider than each of the widths WB11 and WB12.

Because the width WB11 of the base main portion 31BA of the bipolar transistor Q1A of the first amplifier circuit 11A and the width WB12 of the base main portion 31BA of the bipolar transistor Q1B of the second amplifier circuit 11B are different, the first amplifier circuit 11A and the second amplifier circuit 11B are different in the gain and the maximum output.

Because of the switch 42, the amplifier circuit that receives supply of the base bias from the base bias circuit 40 operates, and the amplifier circuit that does not receive supply of the base bias substantially does not operate.

Next, advantageous effects of the second example are described.

The first amplifier circuit 11A and the second amplifier circuit 11B are different in the gain. Thus, in the case where a higher gain is required, a necessary gain can be obtained by supplying the base bias to the amplifier circuit that has a higher gain. Further, in the case where a higher gain is not required, the base bias may be supplied to the amplifier circuit that has a lower gain. The maximum output of the amplifier circuit having a lower gain is greater than the maximum output of the amplifier circuit having a higher gain. Because of this, it becomes possible to increase the output of the preceding stage amplifier circuit by causing the amplifier circuit having the lower gain to operate.

Further, the width WB2 of the base main portion 31BA of the final stage bipolar transistor Q2 is wider than each of the widths WB11 and WB12 of the base main portions 31BA of the preceding stage bipolar transistors Q1A and Q1B, and thus, as is the case with the first example, the maximum output of the final stage amplifier circuit 12 can be increased.

Next, a power amplifier according to a modified example of the second example is described. In the second example, the base bias is supplied to one of the first amplifier circuit 11A and the second amplifier circuit 11B in the preceding stage. However, the base bias may alternatively be supplied to both amplifier circuits. When the both the first amplifier circuit 11A and the second amplifier circuit 11B are put into operation, the gain and the maximum output are equal to values between the gain and the maximum output when only the first amplifier circuit 11A is put into operation and the gain and the maximum output when only the second amplifier circuit 11B is put into operation.

Third Example

Figure 8:
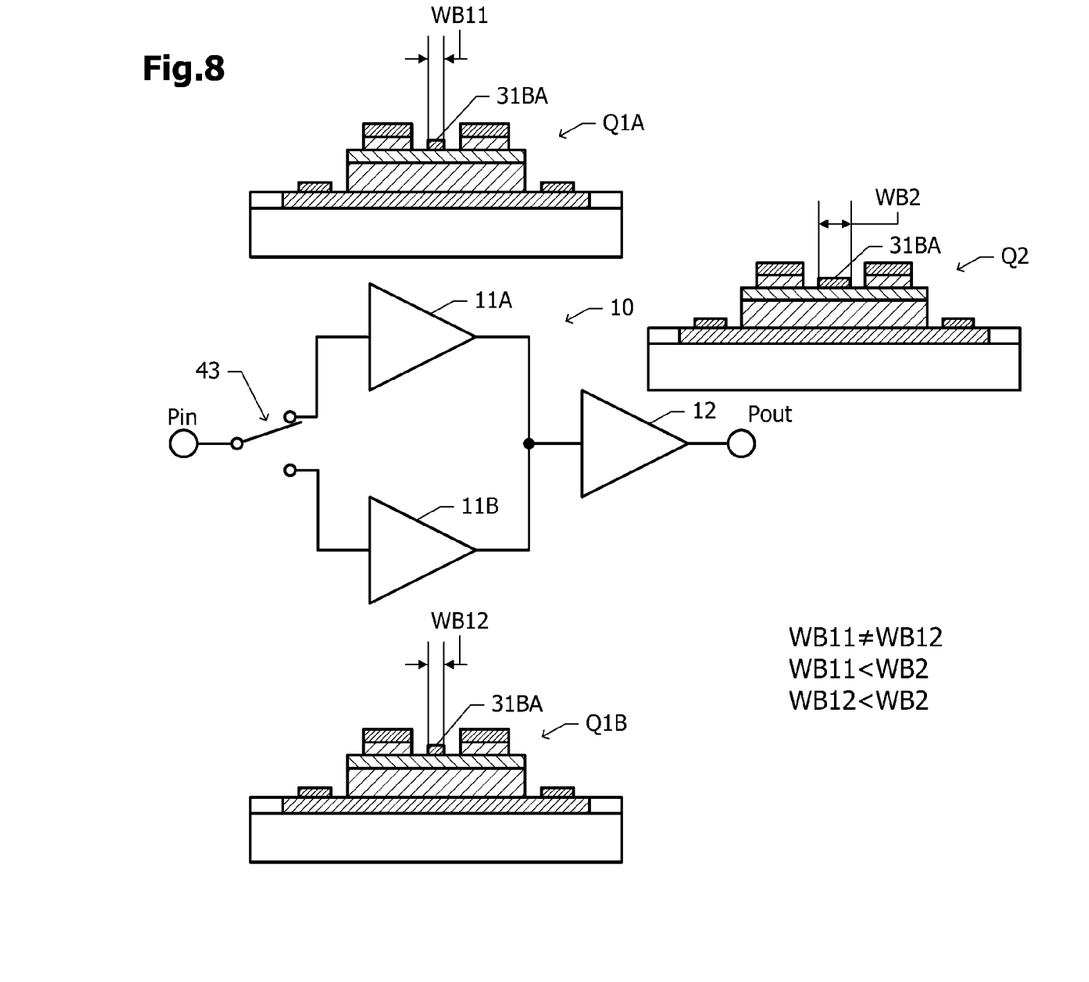
FIG. 8 illustrates a block diagram of a power amplifier according to a third example and schematic sectional views of plural bipolar transistors being used in the power amplifier.

Next, referring to FIG. 8, a power amplifier according to a third example is described. In the following section, descriptions regarding configurations common to those of the power amplifier according to the second example described with reference to FIG. 7 are omitted.

FIG. 8 illustrates a block diagram of a power amplifier 10 according to the third example and schematic sectional views of plural bipolar transistors being used in the power amplifier 10. In the second example (FIG. 7), the first amplifier circuit 11A and the second amplifier circuit 11B are connected in parallel at both input side and output side. In contrast, in the third example, the first amplifier circuit 11A and the second amplifier circuit 11B are connected in parallel at output side and are connected to a switch 43 at input side.

The switch 43 selects one of the first amplifier circuit 11A and the second amplifier circuit 11B. A radio frequency signal input from the input port Pin is input to the amplifier circuit that is selected by the switch 43. The radio frequency signal is amplified by the amplifier circuit that is one of the first amplifier circuit 11A and the second amplifier circuit 11B selected by the switch 43, and the amplified radio frequency signal is input to the final stage amplifier circuit 12.

As is the case with the second example, the width WB11 of the base main portion 31BA of the bipolar transistor Q1A of the first amplifier circuit 11A is different from the width WB12 of the base main portion 31BA of the bipolar transistor Q1B of the second amplifier circuit 11B.

Next, advantageous effects of the third example are described.

As is the case with the second example, also in the third example, a necessary gain can be obtained by amplifying a radio frequency signal by using the amplifier circuit having the higher gain out of the first amplifier circuit 11A and the second amplifier circuit 11B. Further, the maximum output of the preceding stage amplifier circuit can be increased by amplifying a radio frequency signal by using the amplifier circuit having the lower gain out of the first amplifier circuit 11A and the second amplifier circuit 11B.

Fourth Example

Figure 9:
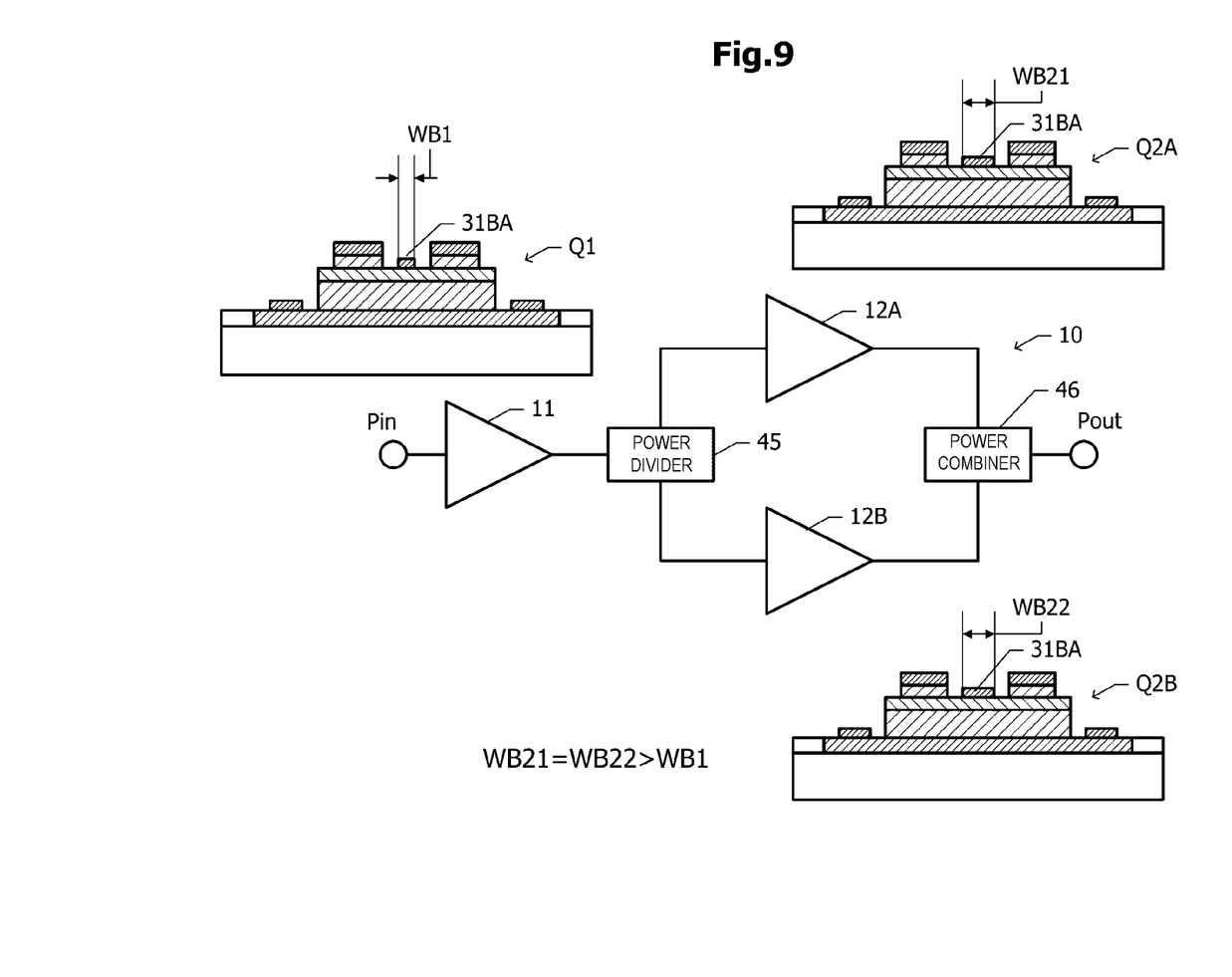
FIG. 9 illustrates a block diagram of a power amplifier according to a fourth example and schematic sectional views of plural bipolar transistors being used in the power amplifier.

Next, referring to FIG. 9, a power amplifier according to a fourth example is described. In the following section, descriptions regarding configurations common to those of the power amplifier according to the first example described with reference to the drawings of FIG. 1 to FIG. 4 are omitted.

FIG. 9 illustrates a block diagram of a power amplifier 10 according to the fourth example and schematic sectional views of plural bipolar transistors being used in the power amplifier 10. In the fourth example, the final stage amplifier circuit 12 is made up of two amplifier circuits, which are a third amplifier circuit 12A and a fourth amplifier circuit 12B. A radio frequency signal amplified in the preceding stage amplifier circuit 11 is divided by a power divider 45, and divided signals are input to the third amplifier circuit 12A and the fourth amplifier circuit 12B. Radio frequency signals output from the third amplifier circuit 12A and the fourth amplifier circuit 12B are combined by a power combiner 46, and a combined signal is output from the output port Pout.

The width WB21 of the base main portion 31BA of a bipolar transistor Q2A of the third amplifier circuit 12A is approximately the same as the width WB22 of the base main portion 31BA of a bipolar transistor Q2B of the fourth amplifier circuit 12B. The width WB21 of the base main portion 31BA and the width WB22 of the base main portion 31BA are wider than the width WB1 of the base main portion 31BA of the preceding stage bipolar transistor Q1.

Next, advantageous effects of the fourth example are described.

In the fourth example, the output of the third amplifier circuit 12A and the output of the fourth amplifier circuit 12B are combined in the final stage, and thus, a greater maximum output can be obtained. Furthermore, as is the case with the first example, the power amplifier as a whole can obtain a sufficient gain by increasing the gain of the amplifier circuit 11 by narrowing the width WB1 of the base main portion 31BA of the preceding stage bipolar transistor Q1.

Next, a modified example of the fourth example is described.

In the fourth example, radio frequency signals having the same phase are input to the third amplifier circuit 12A and the fourth amplifier circuit 12B. However, differential signals may alternatively be input to the third amplifier circuit 12A and the fourth amplifier circuit 12B. For example, by using, in place of the power divider 45, a first balun that transforms a single-ended signal into differential signals and using, in place of the power combiner 46, a second balun that transforms the differential signals into a single-ended signal, it becomes possible to operate the third amplifier circuit 12A and the fourth amplifier circuit 12B as a differential amplifier.

Needless to say, each of the foregoing examples is for illustrative purposes only, and constituent elements illustrated in different examples may be partially exchanged or combined. Similar functions and effects produced by similar constituting elements of different examples are not repeated in every example. Furthermore, the present disclosure is not limited to the foregoing examples. For example, it would be obvious to a person skilled in the art that various changes, improvements, combinations, or the like can be made.

What is claimed is:

1. A power amplifier comprising:
   amplifier circuits of multiple stages, wherein
   each of the amplifier circuits of multiple stages includes at least one bipolar transistor and a base electrode,
   each bipolar transistor included in each of the amplifier circuits of multiple stages includes a collector layer placed on a substrate, a base layer placed on the collector layer, and at least one emitter mesa placed on part of a region of the base layer, and the at least one emitter mesa has a shape elongated in one direction in plan view,
   the base electrode includes at least one base main portion arranged in such a manner as to be separated from the emitter mesa with a gap in a direction orthogonal to a lengthwise direction of the emitter mesa in plan view, and the base main portion of the base electrode has a shape elongated in a direction parallel to the lengthwise direction of the emitter mesa in plan view and is electrically connected to the base layer, and
   of the amplifier circuits of multiple stages, a width, which is a dimension in the direction orthogonal to the lengthwise direction, of each base main portion of the bipolar transistor of a final stage amplifier circuit is wider than a width, which is a dimension in the direction orthogonal to the lengthwise direction, of each base main portion of the bipolar transistor of another stage amplifier circuit.

2. The power amplifier according to claim 1, wherein
   the amplifier circuits of multiple stages include at least two amplifier circuits that precede the final stage amplifier circuit, the at least two amplifier circuits being a first amplifier circuit and a second amplifier circuit that are connected in parallel to each other at output side, and
   the bipolar transistor included in the first amplifier circuit and the bipolar transistor included in the second amplifier circuit are different in a width of the base main portion.

3. The power amplifier according to claim 2, further comprising:
   a base bias circuit, wherein
   the first amplifier circuit and the second amplifier circuit are further connected in parallel to each other at input side, and
   the base bias circuit is configured to select one of the first amplifier circuit and the second amplifier circuit and supply a base bias to the bipolar transistor of an amplifier circuit that has been selected.

4. The power amplifier according to claim 2, further comprising:
   a switch configured to selectively input a signal to one of the first amplifier circuit and the second amplifier circuit.

5. The power amplifier according to claim 1, further comprising:
   a power divider; and
   a power combiner, wherein
   the final stage amplifier circuit of the amplifier circuits of multiple stages includes a third amplifier circuit and a fourth amplifier circuit,
   the power divider is configured to divide power of an output signal of a preceding stage amplifier circuit and supply divided power to the third amplifier circuit and the fourth amplifier circuit, and
   the power combiner is configured to combine power of an output signal of the third amplifier circuit and power of an output signal of the fourth amplifier circuit.

6. The power amplifier according to claim 1, further comprising:
   a first balun; and
   a second balun, wherein
   the final stage amplifier circuit of the amplifier circuits of multiple stages includes a third amplifier circuit and a fourth amplifier circuit,
   the first balun is configured to transform a single-ended signal output from a preceding stage amplifier circuit into differential signals and input the differential signals to the third amplifier circuit and the fourth amplifier circuit, and
   the second balun is configured to transform differential signals output from the third amplifier circuit and the fourth amplifier circuit into a single-ended signal.

7. The power amplifier according to claim 2, further comprising:
   a power divider; and
   a power combiner, wherein
   the final stage amplifier circuit of the amplifier circuits of multiple stages includes a third amplifier circuit and a fourth amplifier circuit,
   the power divider is configured to divide power of an output signal of a preceding stage amplifier circuit and supply divided power to the third amplifier circuit and the fourth amplifier circuit, and
   the power combiner is configured to combine power of an output signal of the third amplifier circuit and power of an output signal of the fourth amplifier circuit.

8. The power amplifier according to claim 3, further comprising:
   a power divider; and
   a power combiner, wherein
   the final stage amplifier circuit of the amplifier circuits of multiple stages includes a third amplifier circuit and a fourth amplifier circuit,
   the power divider is configured to divide power of an output signal of a preceding stage amplifier circuit and supply divided power to the third amplifier circuit and the fourth amplifier circuit, and
   the power combiner is configured to combine power of an output signal of the third amplifier circuit and power of an output signal of the fourth amplifier circuit.

9. The power amplifier according to claim 4, further comprising:
   a power divider; and
   a power combiner, wherein
   the final stage amplifier circuit of the amplifier circuits of multiple stages includes a third amplifier circuit and a fourth amplifier circuit,
   the power divider is configured to divide power of an output signal of a preceding stage amplifier circuit and supply divided power to the third amplifier circuit and the fourth amplifier circuit, and the power combiner is configured to combine power of an output signal of the third amplifier circuit and power of an output signal of the fourth amplifier circuit.

10. The power amplifier according to claim 2, further comprising:

a first balun; and a second balun, wherein the final stage amplifier circuit of the amplifier circuits of multiple stages includes a third amplifier circuit and a fourth amplifier circuit, the first balun is configured to transform a single-ended signal output from a preceding stage amplifier circuit into differential signals and input the differential signals to the third amplifier circuit and the fourth amplifier circuit, and the second balun is configured to transform differential signals output from the third amplifier circuit and the fourth amplifier circuit into a single-ended signal.

11. The power amplifier according to claim 3, further comprising:

a first balun; and a second balun, wherein the final stage amplifier circuit of the amplifier circuits of multiple stages includes a third amplifier circuit and a fourth amplifier circuit, the first balun is configured to transform a single-ended signal output from a preceding stage amplifier circuit into differential signals and input the differential signals to the third amplifier circuit and the fourth amplifier circuit, and the second balun is configured to transform differential signals output from the third amplifier circuit and the fourth amplifier circuit into a single-ended signal.

12. The power amplifier according to claim 4, further comprising:

a first balun; and a second balun, wherein the final stage amplifier circuit of the amplifier circuits of multiple stages includes a third amplifier circuit and a fourth amplifier circuit, the first balun is configured to transform a single-ended signal output from a preceding stage amplifier circuit into differential signals and input the differential signals to the third amplifier circuit and the fourth amplifier circuit, and the second balun is configured to transform differential signals output from the third amplifier circuit and the fourth amplifier circuit into a single-ended signal.

* * * * *